(12) United States Patent
Takata et al.

(10) Patent No.: US 6,278,187 B1
(45) Date of Patent: Aug. 21, 2001

(54) SEMICONDUCTOR DEVICE HAVING AN IMPROVED INTERLAYER CONDUCTOR CONNECTIONS AND A MANUFACTURING METHOD THEREOF

(75) Inventors: Yoshifumi Takata; Yuichi Sakai; Hiroyuki Chibahara; Masanobu Iwasaki, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/122,650

(22) Filed: Jul. 27, 1998

(30) Foreign Application Priority Data

Feb. 16, 1998 (JP) .................................................. 10-033204

(51) Int. Cl.[7] .................................................. H01L 23/48
(52) U.S. Cl. .......................................... 257/758; 257/391
(58) Field of Search .................................. 257/758, 391, 257/390, 314, 759, 760

(56) References Cited

U.S. PATENT DOCUMENTS

| 5,734,187 | * | 3/1998 | Bohr et al. | 257/758 |
| 5,929,525 | * | 7/2000 | Lin | 257/758 |
| 6,107,666 | * | 8/2000 | Chang et al. | 257/758 |

FOREIGN PATENT DOCUMENTS

| 7-288244 | 10/1995 | (JP) . |
| 8-236524 | 9/1996 | (JP) . |
| 9-167797 | 6/1997 | (JP) . |
| 9-186237 | 7/1997 | (JP) . |
| 9-213698 | 8/1997 | (JP) . |
| 9-326392 | 12/1997 | (JP) . |
| 11-67901 | 3/1999 | (JP) . |
| 11-87651 | 3/1999 | (JP) . |

* cited by examiner

Primary Examiner—Roy Potter
(74) Attorney, Agent, or Firm—McDermott, Will & Emery

(57) ABSTRACT

There is described a semiconductor device which prevents a short circuit between a wiring layer formed in interlayer insulating films and vertical conductor plugs formed in the vicinity of the wiring layer, and a method of manufacturing the semiconductor device. The semiconductor device includes a first interlayer insulating film smoothly formed on a semiconductor substrate, conductor plugs which are formed by filling openings formed in the first interlayer insulating film so as to be level with the surface of the first interlayer insulating film, a second interlayer insulating film formed on the surface of the first interlayer insulating film and of the conductor plugs, a wiring pattern formed on the second interlayer insulating film, a third interlayer insulating film formed on the surface of the second interlayer insulating film so as to cover the wiring pattern, and an interconnect conductor formed so as to be electrically connected to the conductor plugs by filling the openings penetrating the second and third interlayer insulating films.

8 Claims, 14 Drawing Sheets

MEMORY ARRAY REGION    LOGIC CIRCUIT REGION

MEMORY ARRAY REGION    LOGIC CIRCUIT REGION

MEMORY ARRAY REGION  LOGIC CIRCUIT REGION

SEMICONDUCTOR DEVICE HAVING AN IMPROVED INTERLAYER CONDUCTOR CONNECTIONS AND A MANUFACTURING METHOD THEREOF

BACKGROUND OF THE INVENTION

1. Field of the Invention

The present invention relates to a semiconductor device and a method of manufacturing the same. More particularly, the present invention relates to a semiconductor device comprising an interlayer insulating film with openings formed therein, and electrodes formed by filling the inside of the opening with a conductive substance.

2. Background Art

The width of an internal wiring pattern or the size of an interconnect opening are decreased as the density of integration of a semiconductor integrated circuit is increased. It has been attempted that a surface of an interlayer insulating film is leveled or smoothed to form a minute resist pattern by photolithography, and thereafter a metal plug is formed by filling a conductive substance into the inside of a minute interconnect opening.

In order to fill a conductive substance inside the interconnect opening formed in the interlayer insulating film, there has been a widely used method by which a conductive substance is formed over the entire surface of a wafer and is etched anisotropically. This manufacturing method will now be described with reference to FIGS. 15 through 19.

First, as shown in FIG. 15, on a semiconductor substrate 1, an isolation oxide film 2, gate electrodes 3, source/drain regions 4 for forming transistors, and a first interlayer insulating film 5 are formed in this sequence. Thus, the semiconductor wafer 100 is formed.

First interconnect openings 6 are formed in the first interlayer insulating film 5 until they reach the source/drain regions 4. The first interlayer insulating film 5 works to electrically insulates the gate electrodes 3 and to form a smooth surface on the wafer. More specifically, in order to accurately form a resist pattern by the photolithography at the time of formation of the first interconnect openings 6 or formation of a first wiring layer (which will be described later) on the first interlayer insulating film 5, it is significantly important to ensure a sufficient focal depth by smoothing the surface of the wafer through use of the first interlayer insulating film 5.

Next, as shown in FIG. 6, a conductor film (not shown) is formed over the entire internal surface of each of the first interconnect openings 6. A chemical vapor deposition technique is usually used for filling the inside of each minute-diameter interconnect opening 6 with a conductive substance without a void. In many cases, polycrystalline silicon, amorphous silicon, metal having a high melting point such as W, TiN or TiSi, or their compounds are used as material for a conductor film.

Subsequently, the conductor film is removed from the surface of the first interlayer insulating film 5 by subjecting the entire surface of the wafer to anisotropic etching. As a result, a first conductor plug 8 is formed in only the inside of each first interconnect opening 6. In consideration of the uniform thickness of the conductor film and the uniformity of the wafer surface after the etch-back, the wafer is usually etched to a depth which is equal to or greater than the thickness of the conductor film, thereby completely removing the conductor film on the surface of the first interlayer insulating film 5.

As shown in FIG. 16, if the wafer is insufficiently etched, etch residues 77 which are part of the conductor film are left on the surface of the wafer 100. If a first wiring layer (which will be described later) is formed over the surface of the wafer 100 in this state, electrical short circuits among wiring patterns may be caused. To prevent such failures, the wafer is usually etched to a depth which is greater than the thickness of the conductor film. As shown in FIG. 17, the wafer 100 is subjected to an etch-back treatment so as to completely eliminate etch residues from the surface of the wafer.

As mentioned previously, under the conventional method by which the conductor plug 8 is formed inside the interconnect opening 6 by anisotropically etching back the conductor film formed on the surface of the interlayer insulating film 5, the wafer is over-etched so as to prevent etch residues from being left on the surface of the wafer 100. For this reason, the surface of the first conductor plug 8 after over-etching is usually recessed about hundreds to thousands Angstroms below the surface of the first interlayer insulating film 5.

Next, as shown in FIG. 18, a second interlayer insulating film 9 is thinly formed on the wafer so as to cover the first interlayer insulating film 5 and the first conductor plug 8, and then a first wiring layer 10 is formed. The second interlayer insulating film 9 protects the surface of the conductor plug 8 when the first wiring layer 10 is formed by etching.

In recent years, with a view toward increasing the density of integration of a semiconductor integrated circuit device, an interval of the first wiring layers 10 is reduced, and the distance between the first wiring layer 10 and the first interconnect opening 6 are simultaneously reduced. If alignment errors arise during photolithography, the first wiring layer 10 may be formed so as to be partly superimposed on the first conductor plug 8. At that time, the second interlayer insulating film 9 prevents an electrical short circuit between the first wiring layer 10 and the first conductive plug 8.

If the surface of the first conductor plug 8 is recessed to a depth (D) of hundreds or more of Angstroms, a recess having substantially the same depth is formed on each conductor plug 8 even after formation of the second interlayer insulating film 9. Then, an etch residue 11 may remain in each recess after the first wiring layer 10 has been formed by etching.

Next, a third interlayer insulating film 12 is formed on the wafer, and the second interconnect openings 13 is formed through the third interlayer insulating film 12 to the surface of each first conductor plug 8. Then, the second interconnect openings 13 is filled with a second conductor plug 14. At this time, the etch residue 11 left in the first interconnect opening 6 may cause a failure such as an electrical short circuit between the first wiring layer 10 and the second conductor plug 14.

FIGS. 20 and 21 are illustrations for explaining the drawbacks in the conventional semiconductor integrated circuit. FIG. 20 is a plan view showing a first wiring layer 10 which is formed by the photolithography and anisotropic etching. FIG. 21 is a cross-sectional view showing the cross-sectional structure of a wafer taken across line XXI—XXI shown in FIG. 20. These drawings corresponds to the manufacturing process shown in FIG. 18.

The first wiring layer 10 should be formed like a wiring pattern 10a. However, the first wiring layer such as wiring pattern 10b or 10c may be formed on the recess formed on the conductor plug 8, so that the etch residue 11 may be formed along the step of each recess. Although the etch residues 11 are insulated from the first conductor plugs 8 by the presence of the second interlayer insulating film 9, the etch residue 11 is in continuation with the first wiring layer 10.

Accordingly, as shown in FIG. 19, when the second conductor plugs 14 are formed, the first wiring layer 10 causes short circuits with the first conductor plug 8 and the second conductor plug 14 by way of the etch residue 11, thereby resulting in a failure.

In addition, as shown in FIGS. 16 through 19, a modified layer 55 is formed along the surface of the first interlayer insulating film 5 by means of fluorine-containing etching gas commonly used for etching back a conductor film 7. The modified layer causes the deterioration of electrical insulating characteristics of the interlayer insulating film 5. If a wiring layer is formed directly on the surface of the interlayer insulating film 5, a short-circuit failure may arise between the wiring patterns.

Further, when the second interlayer insulating film 9 is formed on the first interlayer insulating film 6 after etchback, the second interlayer insulating film 9 may not be formed uniformly, resulting in the deterioration of uniform thickness of the wafer surface. The deterioration of uniform thickness of the wafer causes a deterioration of manufacturing yields of a semiconductor device or variations in the electrical characteristics of products.

In such a conventional technique, the conductor plugs 8 are formed by anisotropic etching, so that insufficient overetching in etch-back process causes etch residues. On the other hand, excess over-ething results in an increase in the depth of the recess formed on the conductor plug 8, thereby causing a short-circuit failure between the wiring pattern and the conductor plug in the subsequent manufacture process.

FIG. 22 shows another conventional manufacturing method intended to solve drawbacks such as those mentioned previously. As shown in FIG. 22, in this conventional method, conductor plugs 8 in the interconnect openings 6 are formed by abrasion and elimination of only the conductor film on the interlayer insulating film 5 through use of a CMP (Chemical-and-Mechanical Polishing) method.

In a case where a conductive substance is abraded through use of an abrasive agent or a slurry for polishing a conductor, the surface of the interlayer insulating film 5 must be smoothed beforehand in a substantially complete manner through use of the CMP method using an abrasive agent for abrading an insulating film. The reason is that even when a wafer has a sufficient flatness to ensure a focal depth for photolithography, surface irregularities may be present in small degrees on the interlayer insulating film 5. Then, etch residues 77 will remain in depressions of steps when a conductor is abraded using an abrasive agent for a conductor.

This is caused because the interlayer insulating film (e.g., a silicon oxide film) 5 is not so much abraded as the conductor by the abrasive agent for a conductor. Etch residues remaining on the interlayer insulating film 5 cause short-circuit failures among wiring patterns in the subsequent manufacturing processes. Therefore, an interlayer insulating film must be smoothed by the CMP method before a plug is formed by abrading a conductor.

Referring to FIG. 23, an explanation will be given of problems associated with preliminary smoothing of the first interlayer insulating film 5 by the CMP method. In the case of a semiconductor memory device such as DRAM or SRAM, a gate electrode wiring pattern 3 is formed at a very high density in a memory array region which includes a plurality of memory elements. In contrast, a gate electrode wiring pattern is comparatively sparsely formed in a logic circuit region which controls the memory elements. For this reason, when the first interlayer insulating film 5 is smoothed by the CMP method, the interlayer insulating film is abraded at a higher rate in the logic circuit region, where the gate electrodes 3 are sparsely formed, than the interlayer insulating film in the memory array region. As a result, a level difference (H) arises in the surfaces of the first interlayer insulating films 5 after abrasion. When a first wiring layer is formed on the wafer by photolithography in a subsequent manufacturing process, defocusing arises to an extent corresponding to the level difference (H), thereby deteriorating the margin of error in the manufacturing process. Further, under the foregoing method, complicated manufacturing processes are required to abrade the interlayer insulating film 5, using the CMP method. Further, the interlayer insulating film 5 needs to be formed with additional thickness to be abraded, and thus the manufacturing cost is increased.

A method of simultaneously abrading a conductor film and an interlayer insulating film through use of an identical abrasive agent is described in Japanese Patent Application Laid-open No. 9-186237. Depending on the materials of the conductor film and the interlayer insulating film, a slight difference arises in polishing rate between the conductor film and the interlayer insulating film, which in turn causes residues of conductor film to be left on the surface of the wafer. In order to prevent such residues, it is necessary to sufficiently smooth the surface of the interlayer insulating film in some way beforehand. Consequently, in terms of reproducibility and manufacturing cost, the foregoing method presents problems. Further, the interlayer insulating film needs to be formed thick beforehand to allow abrasion by the CMP method. This requires deep interconnect openings to be formed anisotropically. Therefore, the dimensional control of the holes is difficult, and the manufacturing cost is increased.

The present invention has been contrived to solve the drawbacks in the conventional method of manufacturing a semiconductor device, and the object of the present invention is to provide a semiconductor device which prevents short circuits between wiring layers and conductor plugs.

Another object of the present invention is to provide a semiconductor device in which wiring patterns may be designed at much shorter distance and miniaturization of the semiconductor integrated circuit device is improved, as well as to provide a method of manufacturing such a semiconductor device.

To attain these objects, in a method of manufacturing a semiconductor device in the present invention, a conductor film is formed over the entire surface of a wafer after interconnect openings have been formed in an interlayer insulating film. Then, conductor plugs are formed inside the interconnect openings by anisotropic etching, and the interlayer insulating film is abraded by a CMP method to a depth of a recess of the conductor plug from the surface of the interlayer insulating film.

SUMMARY OF THE INVENTION

According to one aspect of the present invention, a semiconductor device comprises a first interlayer insulating film formed on a semiconductor substrate and of which surface is leveled. A plurlity of conductor plugs are formed by filling each of a plurality of openings formed in the first interlayer insulating film so as to be level with the surface of the first interlayer insulating film. A second interlayer insulating film is formed on the surface of the first interlayer insulating film and of the conductor plugs. A wiring pattern is formed on the second interlayer insulating film. A third interlayer insulating film is formed on the second interlayer insulating film so as to cover the wiring pattern. A plurality of interconnect conductors are formed by filling each of a plurality of the openings penetrating the second and third interlayer insulating films to the conductor plug, and the interconnect conductors are electrically connected to each of the conductor plugs.

According to another aspect of the present invention, a semiconductor device comprises a first interlayer insulating film continually formed on first and second regions of a semiconductor substrate, and the surface of the first interlayer insulating film is leveled at least in the first region. A plurality of conductor plugs are formed at least in the first region by filling openings formed in the first interlayer insulating film so as to be flush with the surface of the first interlayer insulating film. A second interlayer insulating film is continually formed on the first interlayer insulating film and on the conductor plugs so as to extend over the first and second regions. A wiring pattern is formed on the surface of the second interlayer insulating film in at least the first region. A third interlayer insulating film is formed on the surface of the second interlayer insulating film so as to cover the wiring pattern. A plurality of interconnect conductors are formed in at least the first region by filling each of the openings penetrating the second and third interlayer insulating films to each of the conductor plugs, and the interconnect conductors are electrically connected to each of the conductor plugs.

According to another aspect of the present invention, in a method of manufacturing a semiconductor device, a first interlayer insulating film is formed on a semiconductor substrate. A plurality of openings are formed in the first interlayer insulating film. A conductor film is formed on the first interlayer insulating film so as to fill the openings. The conductor film is removed from the surface of the first interlayer insulating film through chemical etching, and conductor plugs are formed from the conductor film filled in the openings. Finally, the surface of the first interlayer insulating film, from which the conductor film has been removed, is leveled until the surface of the first interlayer insulating film becomes flush with the surface of the conductor plugs by chemical-and-mechanical polishing.

In another aspect of the present invention, further in the semiconductor device manufacturing method, as defined in claim 9, a second interlayer insulating film is formed on the first interlayer insulating film having the conductor plugs formed therein. A wiring pattern is formed on the second interlayer insulating film. A third interlayer insulating film is formed on the second interlayer insulating film so as to cover the wiring pattern. A plurality of openings are formed so as to penetrate the second and third interlayer insulating films respectively to the conductor plugs. Finally, a plurality of interconnect conductors are formed in the openings so as to be electrically connected to each of the conductor plugs.

Other and further objects, features and advantages of the invention will appear more fully from the following description.

BEST MODE FOR CARRYING OUT THE INVENTION

Figure 1:
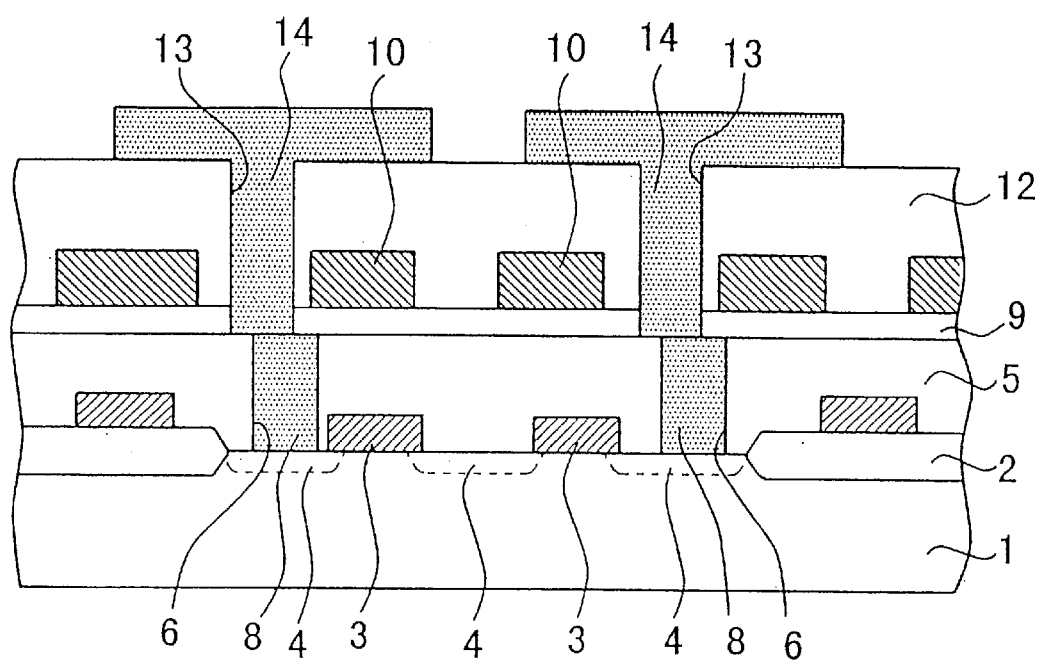
FIGS. 1 and 2 are cross-sectional views respectively showing a structure of a semiconductor device according to a first embodiment of the present invention.

Preferred embodiments of the present invention will be described in detail hereunder by reference to the accompanying drawings. Throughout the drawings, like reference numerals designate like or corresponding parts.

First Embodiment

Figure 2:
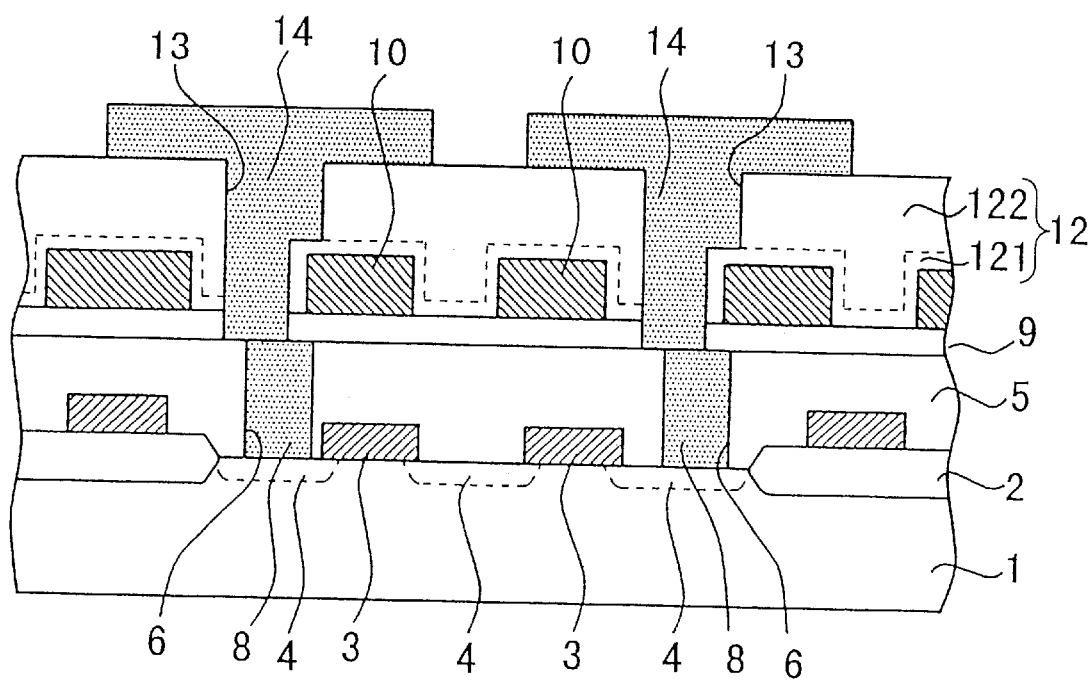

FIGS. 1 and 2 are cross-sectional views respectively showing a structure of a semiconductor device according to a first embodiment of the present invention.

First, the structure of the semiconductor device shown in FIG. 1 will be described. In the semiconductor integrated circuit shown in FIG. 1, reference numeral 1 designates a semiconductor substrate; 2 designates an element isolation oxide film; 3 designates a gate electrode of a transistor; 4 designates a source/drain region of the transistor; 5 designates a first interlayer insulating film formed on the semiconductor substrate 1; 6 designates a first interconnect opening formed so as to penetrate the first interlayer insulating film 5 to the source/drain region 4 of the transistor; and 8 designates a first conductor plug filling the inside of the interconnect opening 6.

Reference numeral 9 designates a second interlayer insulating film; 10 designates a wiring pattern (hereinafter also referred to as a first wiring layer formed on the second interlayer insulating film 9; 12 designates a third interlayer insulating film formed on the second interlayer insulating film 9 so as to cover the wiring pattern 10; 13 designates a second interconnect opening formed so as to penetrate the third interlayer insulating film 12 to the surface of the first conductor plug 8; and 14 designates a second conductor plug formed in the second interconnect opening 13.

A silicon oxide film is usually used as a first interlayer insulating film 5. In some cases, a silicon oxide film containing impurities such as B (Boron) or P (Phosphor) or a multilayered film comprising a silicon nitride film and an impurity-containing silicon oxide film stacked on the silicon nitride film may also be used. Similarly, for the second and third interlayer insulating films 9 and 12, a silicon oxide film or a silicon oxide film containing impurities such as B (Boron) or P (Phosphor) may also be used.

Material of the conductor plug 8 or 14 may be selected from polycrystalline silicon; amorphous silicon; polycrystalline silicon or amorphous silicon containing impurities which are the same type as those of the source/drain region 4; metallic materials having a high melting point such as W, Ti, TiN, Pt, or the like; or silicates having a high melting point such as WSi, TiSi, PtSi, or the like.

Next, the structure of a semiconductor integrated circuit device shown in FIG. 2 will be described.

In the semiconductor integrated circuit device shown in FIG. 2, reference numeral 12 designates a third interlayer insulating film which comprises a silicon nitride film 121 and a silicon oxide film 122 stacked on the silicon nitride film 121. In some cases, a silicon oxide film containing impurities such as B (Boron) or P (Phosphor) may also be used as the silicon oxide film 122.

Reference numeral 13 designates a second interconnect opening formed so as to penetrate the third interlayer insulating film 12 to the surface of the first conductor plug 8. Even if the interconnect openings are misaligned, the first wiring layer 10 is covered with the silicon nitride film 121 and hence remains unexposed. Reference numeral 14 designates a second conductor plug formed in the second interconnect opening 13.

In other respects, the device shown in FIG. 2 is same with the device shown in FIG. 1, and hence repeated explanations will be omitted here.

The semiconductor integrated circuit according to the first embodiment shown in FIG. 1 or 2 is characterized by the first conductor plugs 8 being level with the first interlayer insulating films 5. In short, there is no depression in the surface of the conductor plug 8 which is a problem in the conventional manufacturing methods.

As mentioned previously, according to the present embodiment, the first interlayer insulating film 5 and the first conductor plug 8 are formed so as to form a stepless smooth surface. Therefore, no etch residues stemming from anisotropic etching of the first wiring layer 10 are formed on the surface of the first interlayer insulating film 5, and particularly on the surface of the conductor plug 8.

Accordingly, even if the first wiring layer 10 is formed over the first interconnect opening 6 because of misalignment of a mask at the time of photolithography, no failures occur such as short circuits between the second conductor plug 14 and the first wiring layer 10.

Consequently, the wiring patterns can be designed at much smaller intervals, and miniaturization of the semiconductor integrated circuit device can be effected without inducing electrical failures.

In the first embodiment, the first interlayer insulating films 5 and the first conductor plugs 8 are formed so as to become substantially level with one another. The smoothed surface of the wafer signifies that the surface of the first conductor plug 8 is smoothed to such an extent as to prevent etch residues from being left on depressions in the surface of the first conductor plug 8. It would be ideal if the first interlayer insulating films 5 and the first conductor plugs 8 are completely level with one another. However, even if there are depressions of about tens of Angstroms in the surface of the first conductor plug 8, no problems arise.

Second Embodiment

Next, according to a second embodiment of the present invention, an explanation will be given of a method of manufacturing the semiconductor integrated circuit device having the structure such as that shown in FIG. 1 or 2.

First, FIGS. 3 through 8 show processes for manufacturing the semiconductor integrated circuit device shown in FIG. 1.

Figure 3:
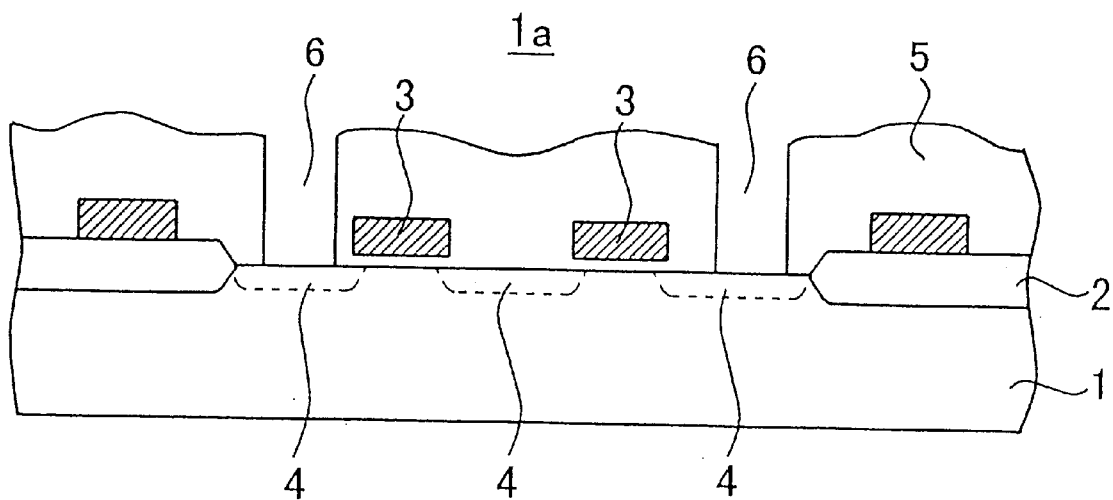
FIGS. 3 through 8 show processes for manufacturing the semiconductor integrated circuit device shown in FIG. 1.

Turning to FIG. 3, an element isolation oxide film 2, a gate electrode 3 of a transistor, a source/drain region 4 of the transistor, and a first interlayer insulating film 5 are formed on the surface of a semiconductor substrate 1. In the following descriptions, the semiconductor substrate 1 or the semiconductor substrate which is subjected to several processing or formation operations in subsequent processes is collectively called a wafer 100.

A silicon oxide film is usually used as the first interlayer insulating film 5. Further, in order to fill the gap between the two adjacent gate electrodes 3 without voids, a silicon oxide film containing impurities such as B(Boron) or P(Phosphor) may be used in some cases. Alternatively, in some cases, a multilayered film comprising an impurity-containing silicon oxide film stacked on a silicon nitride film may also be used.

Particularly, in a case where an interconnect opening is formed in a self-aligned manner (which will be described later) in the gap between the adjacent gate electrodes 3 by utilization of the steps of the gate electrodes 3, a multilayered film, such as a silicon oxide film including the impurities and stacked on a silicon nitride film, is used in many cases in terms of controllability of precise dimension and geometry for forming an interconnect opening by anisotropic etching.

Subsequently, with a view toward improving the flatness of surface of the wafer 100, the wafer is usually subjected to a heat treatment at a temperature of 800 to 850° C. Further, the first interconnect openings 6 are formed in the first interlayer insulating film 5 to reach the source/drain region 4 of the transistor, through photolithography and anisotropic etching. Next, the silicon oxide film at the bottom of each interconnect opening 6 is removed by temporarily subjecting the wafer 100 to a diluted hydrofluoric acid solution.

Figure 4:
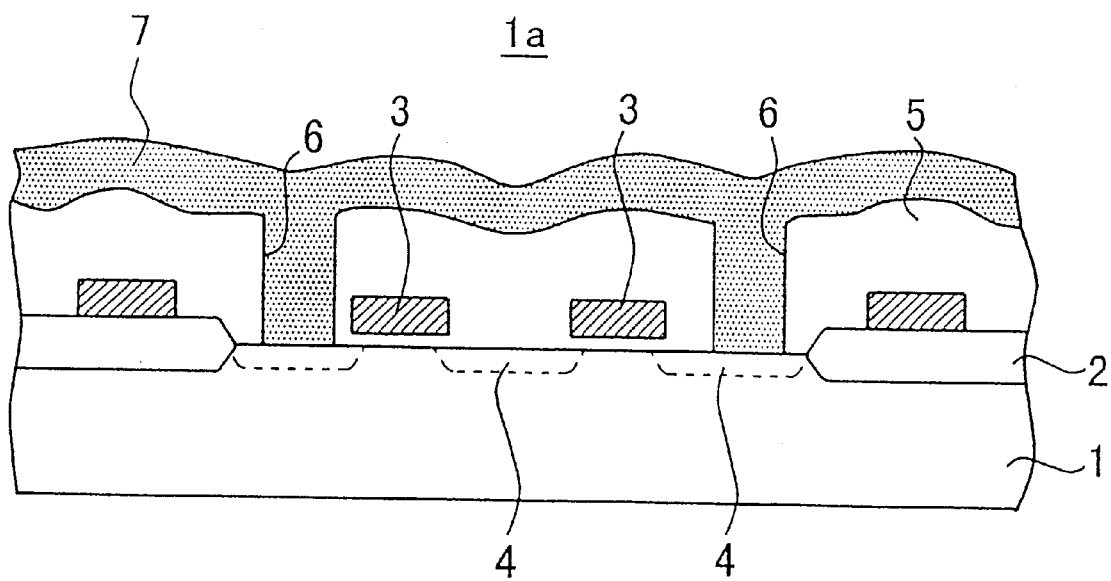

Next, turning to FIG. 4, a conductor film 7 used for forming a conductor plug (which will be described later) is formed inside the interconnect opening 6 and on the surface of the first interlayer insulating film 5.

Material for the conductor film 7 may be selected from polycrystalline silicon, amorphous silicon, polycrystalline silicon or amorphous silicon containing impurities which are the same type as that of the source/drain region 4, metallic materials having a high melting point such as W, Ti, TiN, Pt, or the like; or silicides having a high melting point such as WSi, TiSi, PtSi, or the like.

The conductor film 7 is formed to a thickness which is the same as or greater than the radius of the interconnect opening 6 in order to prevent voids from arising in each interconnect opening 6. If the conductor film 7 is formed to a thickness greater than a required thickness, etch-back process needs to be performed for a longer time following the formation of the conductor film in view of the variations in film thickness. As a result, recesses may grow larger in the conductor plug. Consequently, it is desirable to form the conductor film 7 to a enough thickness to prevent voids in the interconnect opening, but as small a thickness as possible.

Figure 5:
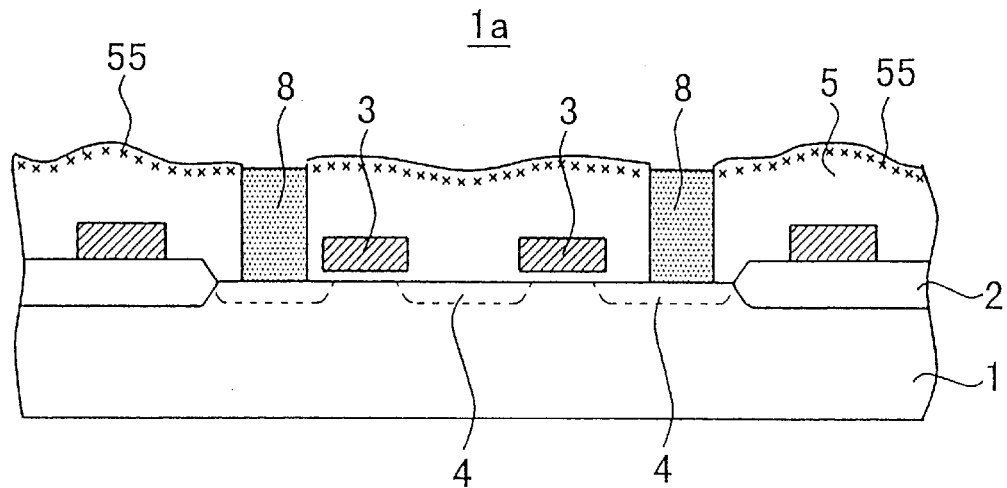

Next, turning to FIG. 5, the wafer 100 is subjected to anisotropic etching which uses etching gas containing chlorine or fluorine such as CF4, SF6, Cl2, or SiCl4, thereby removing the conductor film 7 from the surface of the first interlayer insulating film 5 and forming the first conductor plug 8 in the interconnect opening 6.

At this time, in consideration of uniform thickness of the conductor film 7 or uniformity of the surface of the wafer 100 after etch-back, the wafer is usually etched to a thickness which is greater than the thickness of the first conductor film 7, thereby preventing the conductor film 7 to remain in the recessed portions on the surface of the first interlayer insulating film 5.

As a result, the surface of the first conductor plug 8 is usually recessed to between hundreds and thousands of Angstroms below the surface of the first interlayer insulating film 5. Simultaneously, a surface modified layer 55 is formed along the surface of the first interlayer insulating film 5 by fluorine-containing etching gas, thereby deteriorating the electric insulating characteristics of the interlayer insulating film.

Figure 6:
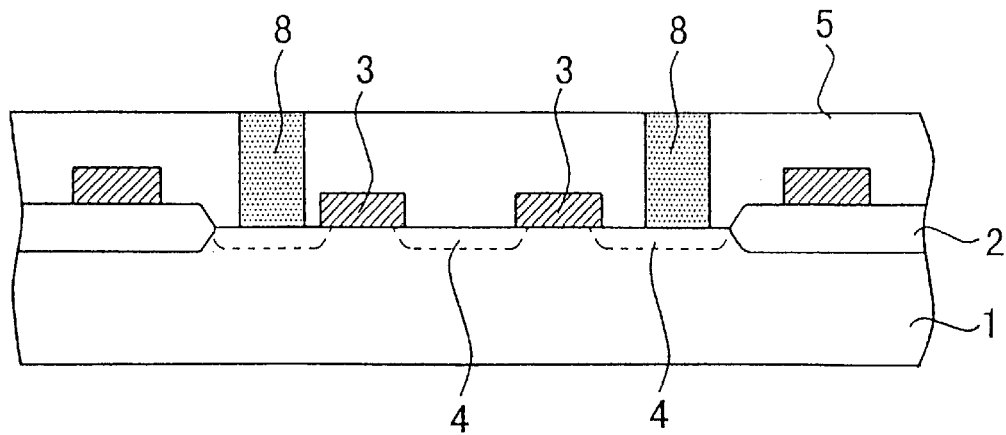

Next, turning to FIG. 6, the surface of the first interlayer insulating film 5 is abraded by the CMP method through use of an abrasive agent for polishing a silicon oxide film. Thereby, the modified layer 55 is removed from the surface of the interlayer insulating films, and the surface of the first conductor plug 8 is leveled to the surface of the first interlayer insulating film 5. For example, abrasive material including colloidal silica or ceric oxide is desirable for the abrasive agent for abrading a silicon oxide film. As mentioned previously, the difference in level between the surface of the first interlayer insulating film 5 and the surface of the conductor plugs 8 is eliminated by abrading the surface of the first interlayer insulating film 5 from hundreds to thousands of Angstroms. Substantial leveling of the surface of the first interlayer insulating film 5 and the surface of the first conductor plug 8 means that the surface of the wafer is smoothed to such an extent as to prevent etch residues from being left in depressions in the surface of the first conductor plug 8. Ideally, the surface of the first interlayer insulating film is completely flush with the surface of the first conductor plug. However, even if there is a level difference of about tens of Angstroms between the first interlayer insulating film and the first conductor plug, no problems will arise.

Even when the wafer 100 is abraded to a depth which is deeper than the actual level of depressions in consideration of variations in the level of the depressions in the surface of the wafer, it takes a short time to abrade the wafer, because the CMP method is originally intended to abrade hundreds to thousands of Angstroms of the surface of a wafer. Therefore, the manufacturing cost will not increase much.

Further, the tests performed by the present inventors have resulted in finding that, in a case where polycrystalline silicon or amorphous silicon is used for the conductor film 7, the polycrystalline silicon or amorphous silicon film can be abraded at a polishing rate ranging from several percentages to tens of percentages of the polishing rate of the silicon oxide film, even through use of an abrasive agent for polishing a silicon oxide film containing colloidal silica. More specifically, it is ascertained from the test results that even if the abrasion takes longer time, the first conductor plugs 8 are prevented from being protruded up or being recessed below the surface of the first interlayer insulating film 5, and steps will not arise between the surface of the conductor plug 8 and the surface of the first interlayer insulating film 5.

The recess in the conductor plug 8 is eliminated by abrasion of the first interlayer insulating film 5, using the CMP method. Simultaneously, depressions in the surface of the interlayer insulating film 5 are also alleviated. Therefore, an increase arises in the margin of error in the manufacturing process at the time a resist pattern is formed for the purpose of forming a first wiring layer (which will be described later) by photolithography in a subsequent process.

Figure 7:
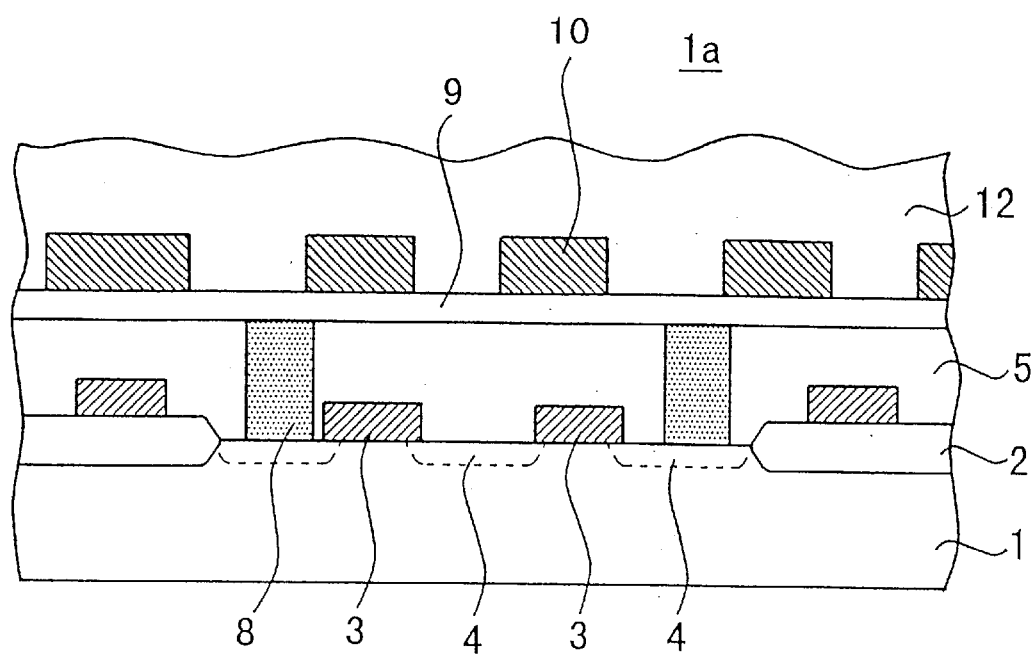

Next, turning to FIG. 7, a second interlayer insulating film 9 is thinly formed on the surface of the first interlayer insulating film 5 and the first conductor plug 8. Subsequently, a conductor film for the purpose of forming a first wiring layer is formed and subjected to photolithography and anisotropic treatments, thereby forming the first wiring layer 10.

Since the first conductor plugs 8 are smoothly formed and have no depressions, etch residues will not remain, which would otherwise be formed on the conductor plugs 8 when the first wiring layer 10 is formed by anisotropic etching.

Next, the third interlayer insulating film 12 is formed so as to cover the first wiring layer 10 and the second interlayer insulating film 9.

The third interlayer insulating film 12 is usually formed from a silicon oxide film, as is the first interlayer insulating film 5. With a view toward filling the gap between the adjacent two first wiring layers 10 without voids, a silicon oxide film containing impurities such as B(Boron) or P(Phosphor) may be used in some cases.

Next, in order to improve the flatness of the surface of the wafer 100, the wafer is usually subjected to a heat treatment at a temperature of 800 to 850° C.

Figure 8:
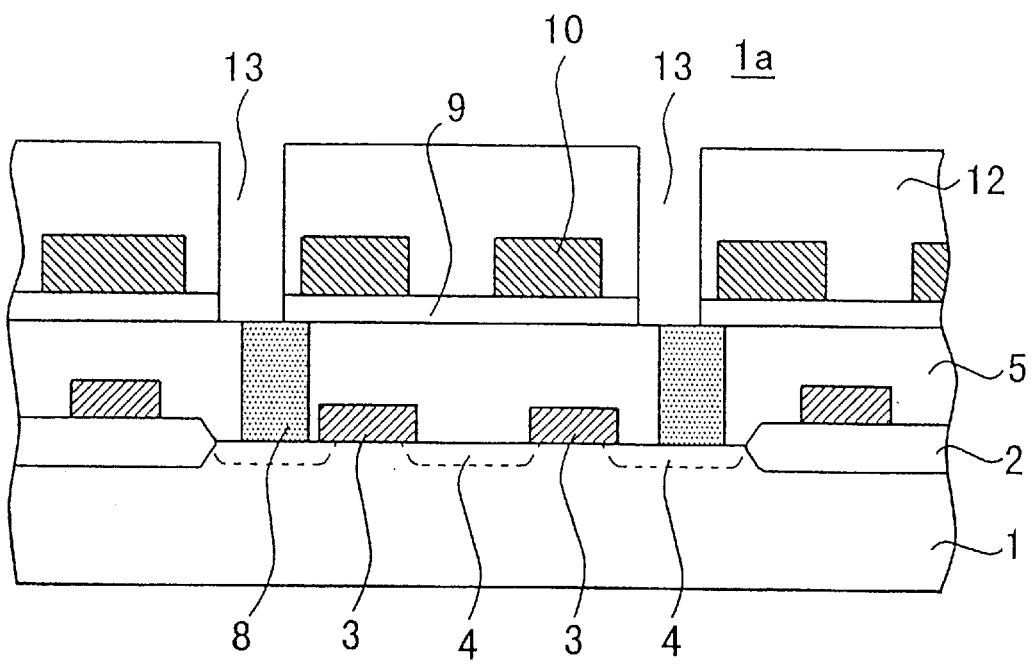

Turning to FIG. 8, a second interconnect opening 13 is formed by photolithography and anisotropic etching so as to penetrate the third interlayer insulating film 12 and the second interlayer insulating film 9 to the surface of each first conductor plug 8.

Subsequently, the surface of the wafer 100 is subjected to a diluted hydrofluoric acid or hydrogen peroxide solution, thereby removing a natural oxide film from the exposed surface of the first conductor plug 8 at the bottom of each second interconnect opening 13.

Next, turning to FIG. 1, a conductive film for forming second conductor plugs 14 is formed, and the thus-formed conductive film is removed from the surface of the third interlayer insulating films 12, thereby forming second conductor plugs 14 (or interconnect conductors) which fill the respective second interconnect openings 13. As a result, the second conductor plugs 14 are electrically connected to the first conductor plugs 8, whereby a semiconductor integrated circuit device is obtained having the cross section shown in FIG. 1.

Figure 9:
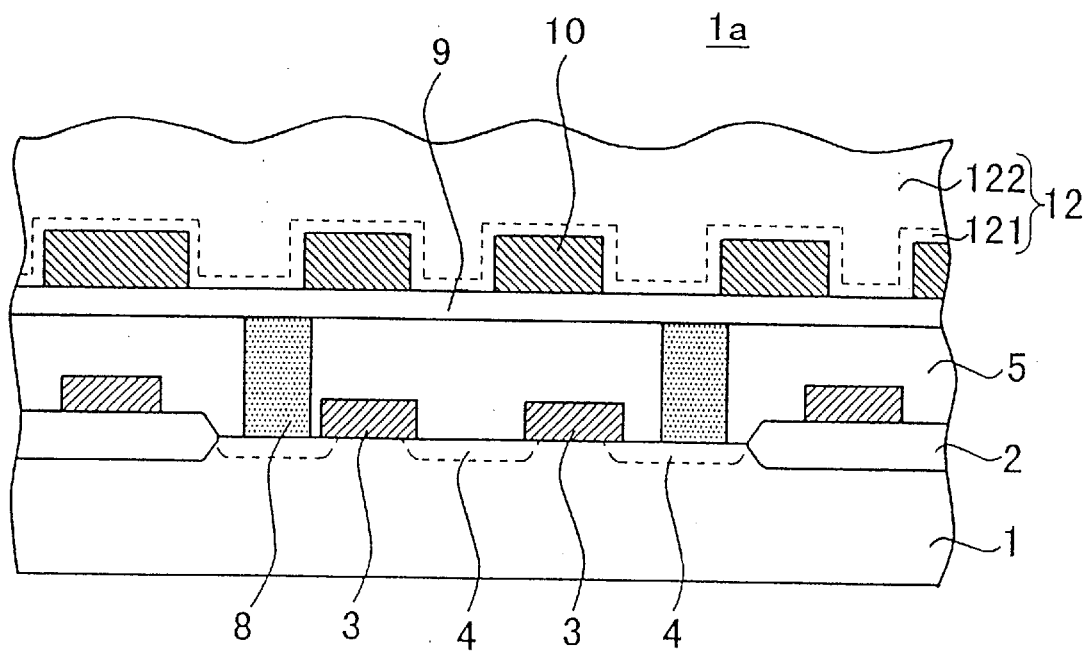
FIGS. 9 and 10 show a part of the process of manufacturing the semiconductor integrated circuit device shown in FIG. 2.
Figure 10:
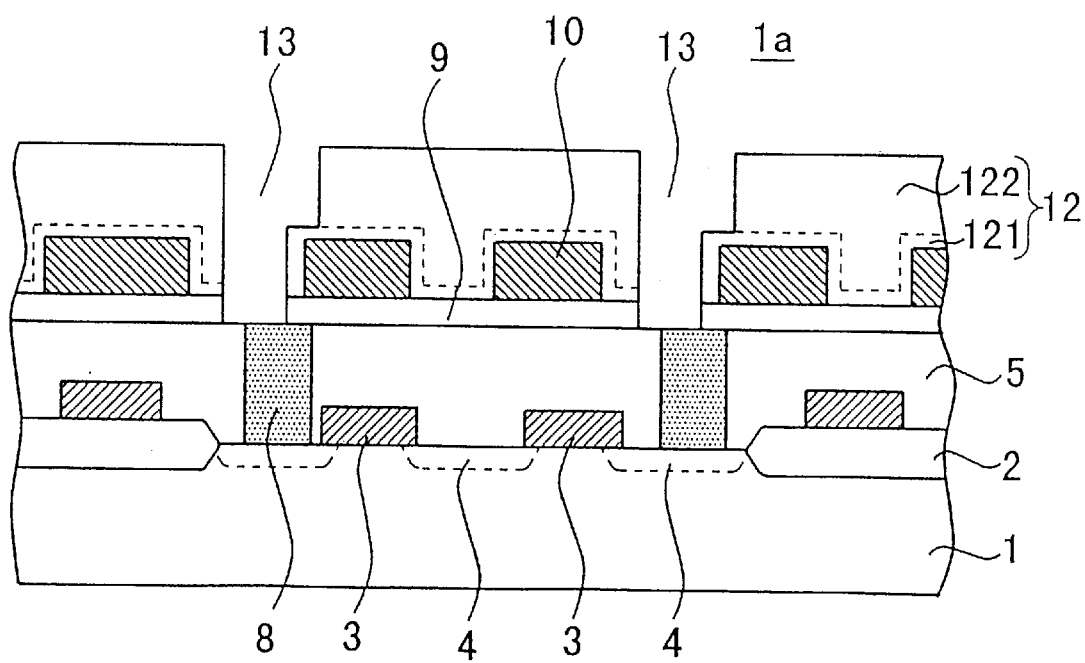

FIGS. 9 and 10 show a part of the process of manufacturing the semiconductor integrated circuit device shown in FIG. 2.

The method of manufacturing a semiconductor device shown in FIG. 2 differs from that mentioned previously in the formation of the third interlayer insulating films 12 shown in FIG. 9.

In this case, as shown in FIG. 9, the third interlayer insulating film 12 is formed by stacking the silicon oxide film 122 on the silicon nitride film 121. A silicon oxide film containing impurities such as B(Boron) or P(Phosphor) may be used as the silicon oxide film in some cases.

Next, turning to FIG. 10, in order to improve the flatness of the surface of the wafer 100, the wafer is usually subjected to a heat treatment at a temperature of 800 to 850° C.

Then, the wafer is subjected to photolithography and anisotropic etching, thereby forming the second interconnect opening 13 which penetrate the third interlayer insulating film 12 to the surface of each first conductor plug 8.

In this case, even if the interconnect openings are misaligned, the first wiring layer 10 is covered with the silicon nitride film (121) and hence remains unexposed.

As mentioned previously, in a case where the interconnect openings are formed in a self-aligned manner by use of the steps of the first wiring layers 10, it is effective to use the silicon oxide film 122, which includes at least P(Phosphor), stacked on the silicon nitride film 121 as the third interlayer insulating film 12, in terms of controllability of the size and shape of the interconnect opening formed by anisotropic etching.

Subsequently, the surface of the wafer 100 is subjected to a diluted hydrofluoric acid or hydrogen peroxide solution, thereby removing a natural oxide film from the exposed surface of the first conductor plug 8 at the bottom of each second interconnect opening 13.

Next, turning to FIG. 2, a conductive film for the purpose of forming second conductor plugs 14 is formed, and the thus-formed conductive film is removed from the surface of the third interlayer insulating films 12, thereby forming the second conductor plugs 14 (or interconnect conductors) which fill the respective second interconnect openings 13. As a result, the second conductor plugs 14 are electrically connected to the first conductor plugs 8, whereby a semiconductor integrated circuit device is obtained which has the cross section shown in FIG. 2.

As mentioned previously, according to the second embodiment, since the first interlayer insulating films 5 and the first conductor plugs 8 are formed so as to form a stepless smooth surface, no etch residues are left on the surface of the first interlayer insulating film 5 when the first wiring layer 10 is formed on the surface of the first interlayer insulating film 5 by anisotropic etching.

Accordingly, even if the first wiring layer 10 is formed on the first interconnect opening 6 as a result of misalignment of a mask at the time of photolithography, a short circuit between the second conductor plug 14 and the first wiring layer 10 is prevented. As a result, the wiring patterns can be designed at much smaller distances, and miniaturization of the semiconductor integrated circuit device can be advanced without causing short circuits.

Further, according to the second embodiment, since the surface modified layer 77, which is formed on the surface of the interlayer insulating film 5 by etching back the conductor film 7, is removed by the CMP method, the insulating characteristics of the interlayer insulating film will not be deteriorated. Failures such as short circuits between wiring patterns are also prevented. Still further, variations in film thickness or the deterioration of reproducibility of a film, which would otherwise be caused by forming a film in an upper layer by CVD, are prevented, and therefore films can be stably grown, resulting in an improvement in the manufacturing yields of a semiconductor device, stabilization of the electrical characteristics of a product, and a reduction in the manufacturing costs.

Third Embodiment

Figure 11:
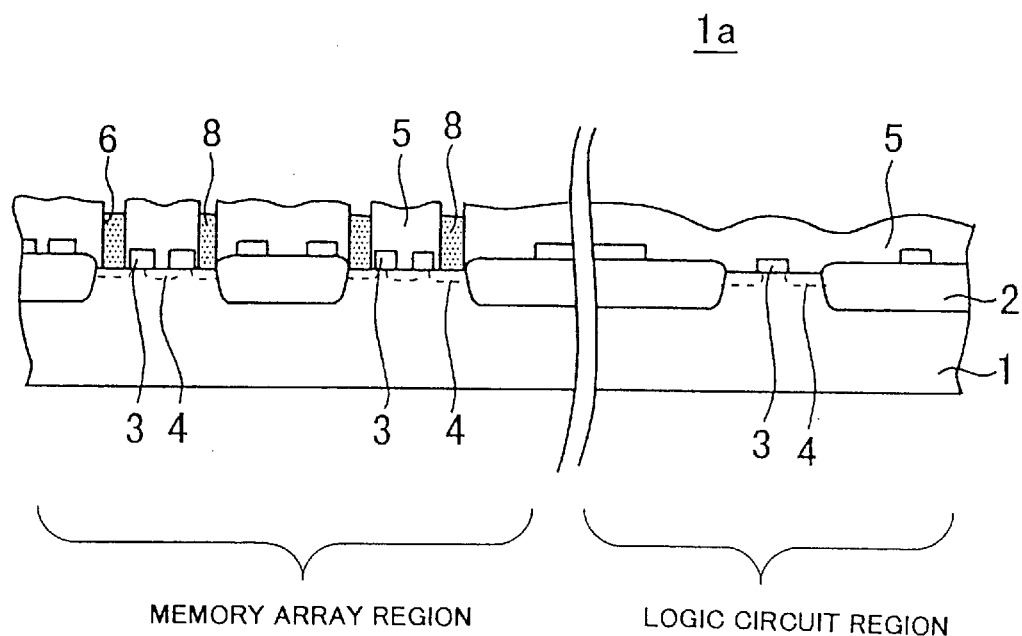
FIGS. 11 through 13 are cross-sectional views showing a method of manufacturing a semiconductor integrated circuit device according to a third embodiment of the present invention.
Figure 12:
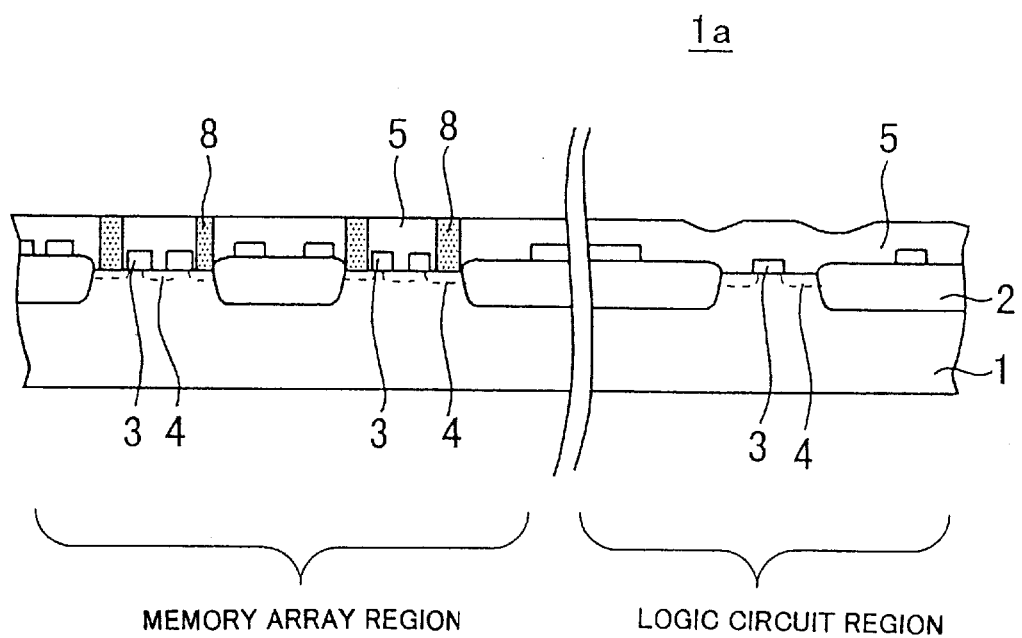
Figure 13:
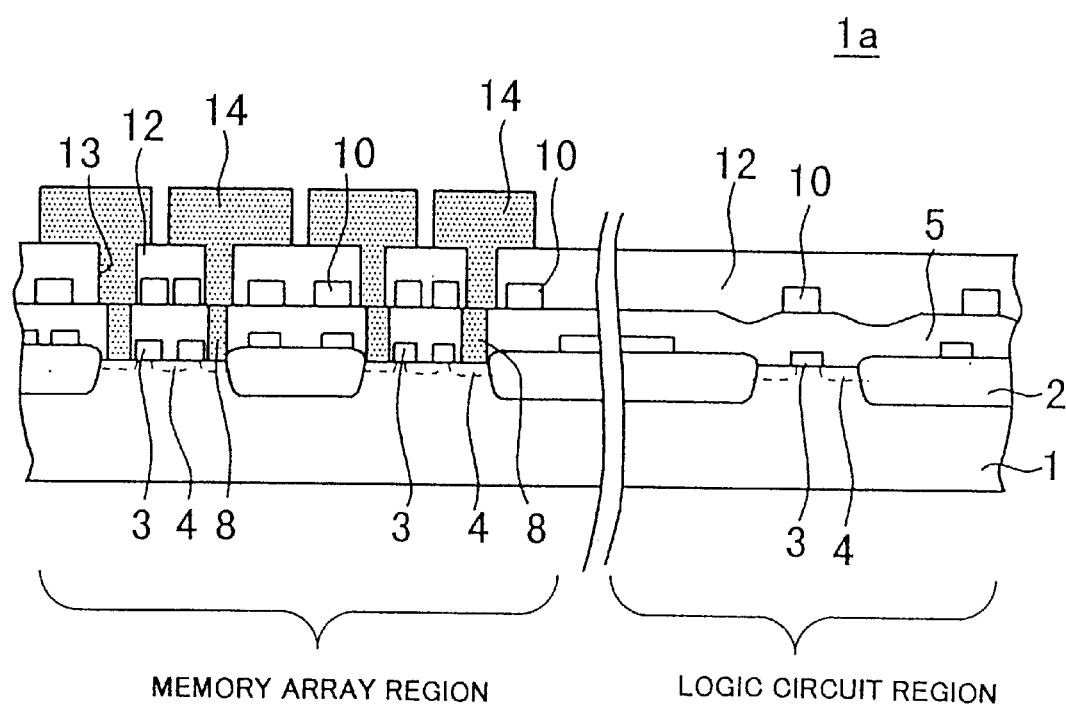

FIGS. 11 through 13 are cross-sectional views showing a method of manufacturing a semiconductor integrated circuit device, according to a third embodiment of the present invention, in accordance with the flow of manufacturing of the semiconductor integrated circuit device. The third embodiment is directed to an example in which the first and second embodiments mentioned previously are applied to manufacture of a semiconductor integrated circuit device.

Turning to FIG. 11, a memory array is formed in a first region located in a left half of the illustrated semiconductor substrate 1, and a logic circuit is formed in a second region located in a right half of the semiconductor substrate. First, an element isolation oxide film 2, a gate electrode 3 of a transistor, and a source/drain region 4 of the transistor are formed on the semiconductor substrate 1. Next, the first interlayer insulating film 5 is formed so as to cover the gate electrodes 3.

Next, the first interconnect openings 6 are formed at least in the memory cell region so as to penetrate the interlayer insulating film 5 to the source/drain region 4. The first conductor plugs 8 are formed in the interconnect openings 6. The conductor plugs 8 are anisotropically etched back so as to prevent etch residues to remain on the surface of the first interlayer insulating film 5. The surface of the conductor plug 8 is recessed below the surface of the interlayer insulating film 5.

Figure 23:
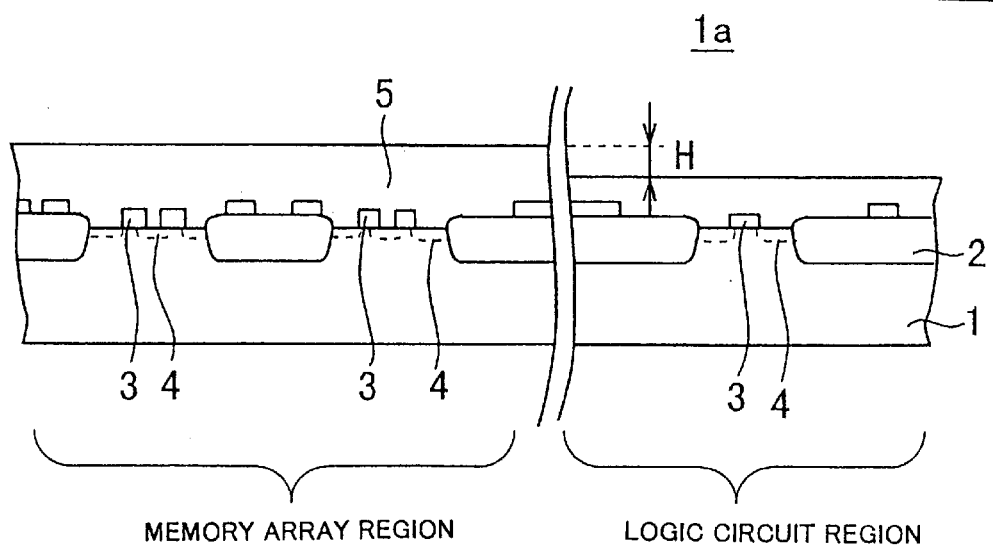
FIG. 23 is an illustration for explaining a problem associated with preliminary smoothing of an interlayer insulating film by a CMP method.

Next, turning to FIG. 12, hundreds to thousands of Angstroms of the surface of the first interlayer insulating film 5 are abraded through use of the CMP method, thereby smoothing the surface of the wafer so as to render the surface of the first interlayer insulating film 5 and the surface of the first conductor plug 8 substantially level with each other. Since the thickness of the interlayer insulating film to be abraded using the CMP method is small, a small difference in thickness arises between the logic circuit region and the memory array region where the gate electrodes 3 and the first conductor plugs 8 are densely formed. Consequently, a step (with height H ) such as that described for the example of the conventional manufacturing method (see FIG. 23) will not formed.

Next, turning to FIG. 13, the second interlayer insulating film 9 (omitted from the drawing for brevity, and see reference numeral 9 shown in FIG. 7) is thinly formed over the surface of the first interlayer insulating film 5 and the first conductor plug 8. Subsequently, a conductor film used for forming a first wiring layer is grown, and the thus-formed conductor film is subjected to photolithography and anisotropic etching, thereby forming a first wiring layer 10 (a wiring pattern). Further, the third interlayer insulating film 12 is formed over the first wiring layer 10.

The second interconnect openings 13 are formed so as to penetrate the third interlayer insulating film 12 and the second interlayer insulating film 9. The second conductor plugs 14 are formed on the third interlayer insulating film 12 so as to fill the inside of the second interconnect openings 13. The second conductor plug 14 is electrically connected with the first conductor plug 8 and is formed to have an enlarged diameter on the third interlayer insulating film 12.

The thus-formed semiconductor integrated circuit device constitutes a semiconductor memory device. The transistor which is formed from the gate 3 and the source/drain region 4 in the memory cell region works as a transistor for use with memory cell. The gate electrodes 3 work as word lines, and the first wiring layers (or wiring patterns) 10 work as bit lines. The second conductor plugs 14 work as electrodes used for storing electrical charges in the semiconductor memory device, or so-called storage nodes.

The surface of the thus-formed first interlayer insulating film 5 is changed to a modified layer (not shown) as a result of anisotropic etching of the first conductor plugs 8. However, hundreds to thousands of Angstroms of the surface of the interlayer insulating film are abraded by CMP.

The method of manufacturing a semiconductor integrated circuit device according to the third embodiment does not cause instability of the characteristics of growth of a film, such as variations in film thickness, when the second interlayer insulating film 9 (not shown, and see FIG. 7 relating to the second embodiment) is formed on the first interlayer insulating film 5.

Since the first interlayer insulating films 5 and the first conductor plugs 8 are formed so as to form a smooth stepless wafer surface, etch residues stemming from anisotropic etching of the first wiring layer 10 are not left on the surface of the first interlayer insulating films 5, and particularly on the surface of the conductor plugs 8.

Consequently, even if the first wiring layer 10 is formed on the first interconnect opening 6 as a result of misalignment of a mask at the time of photolithography, short circuits are prevented from arising between the second conductor plugs 14 and the first wiring layers 10.

Therefore, wiring patterns can be designed at much smaller intervals, enabling miniaturization of a semiconductor integrated circuit device without causing short circuits.

Even when the surface of the first interlayer insulating film 5 is abraded by CMP to thereby eliminate the recess of the first conductor plug 8, substantial steps will not arise between the memory array region and the logic circuit region. Thus, the present invention has the advantage of being able to accurately form the first wiring layer 10 by photolithography.

Figure 14:
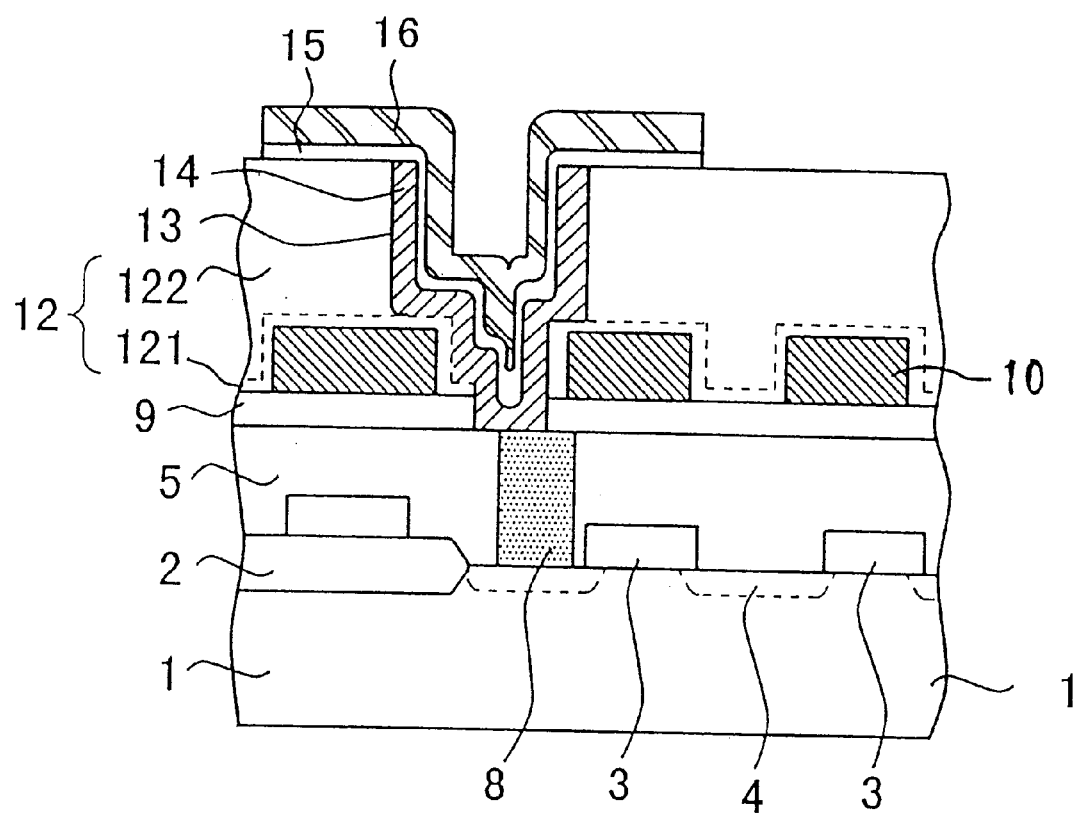
FIG. 14 is a cross-sectional view showing another example of the structure of a semiconductor memory device according to the third embodiment.
Figure 15:
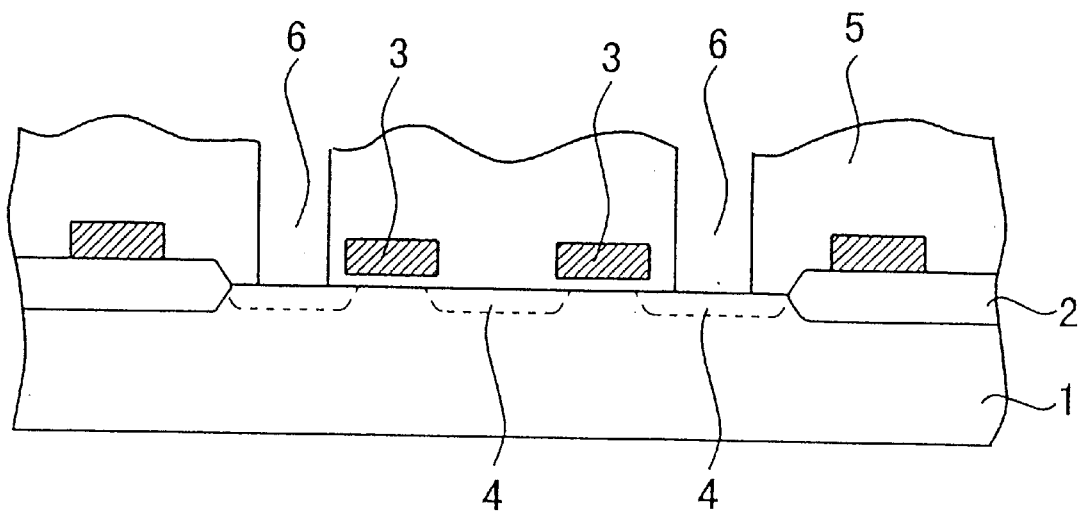
FIGS. 15 through 19 show a conventional process of a manufacturing method of a semiconductor device.
Figure 16:
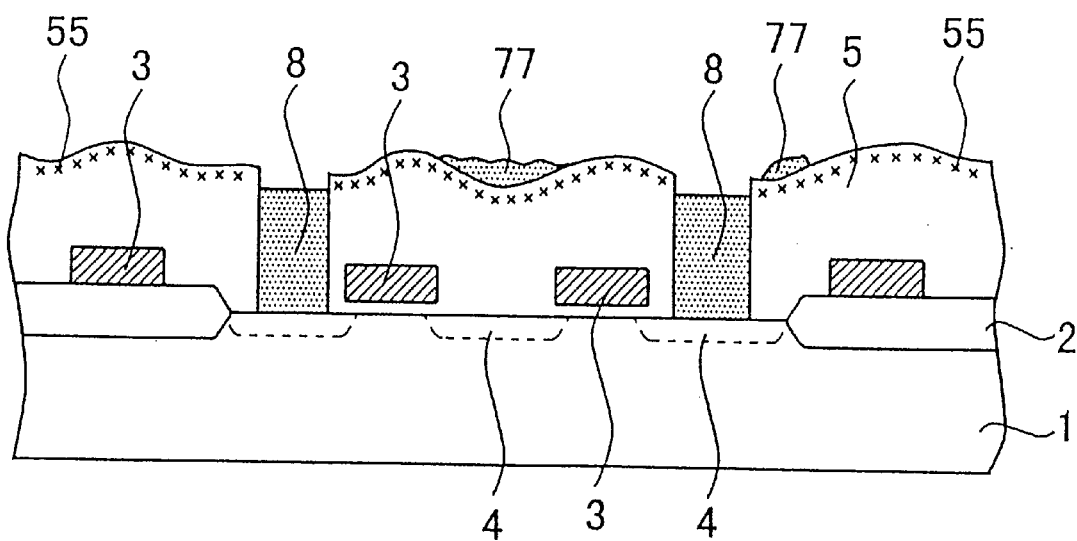
Figure 17:
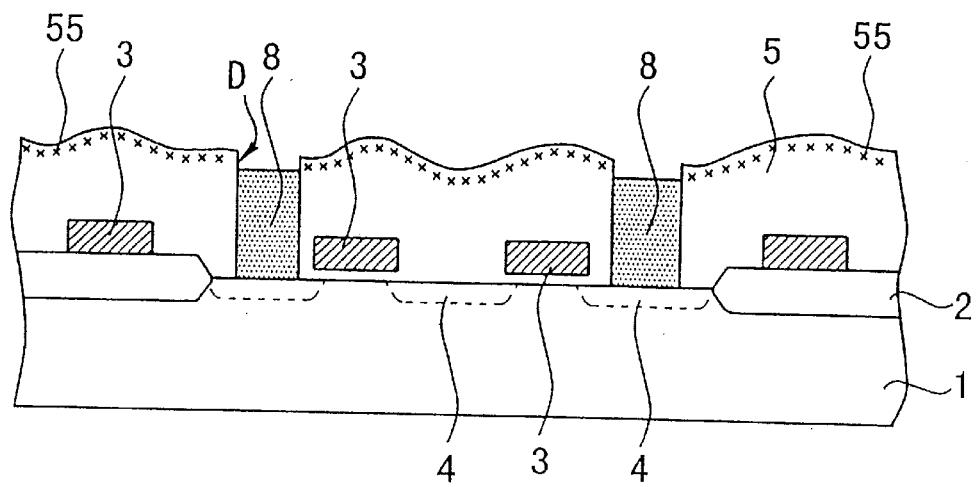
Figure 18:
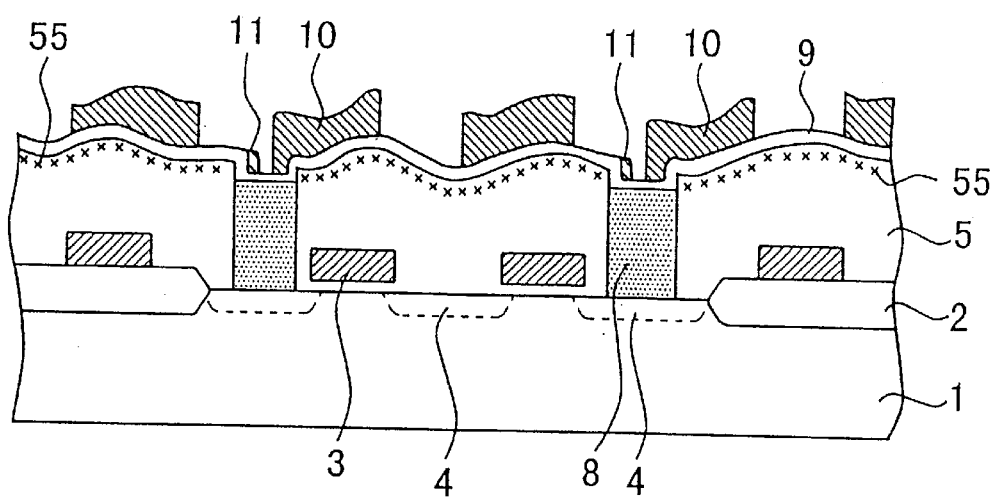
Figure 19:
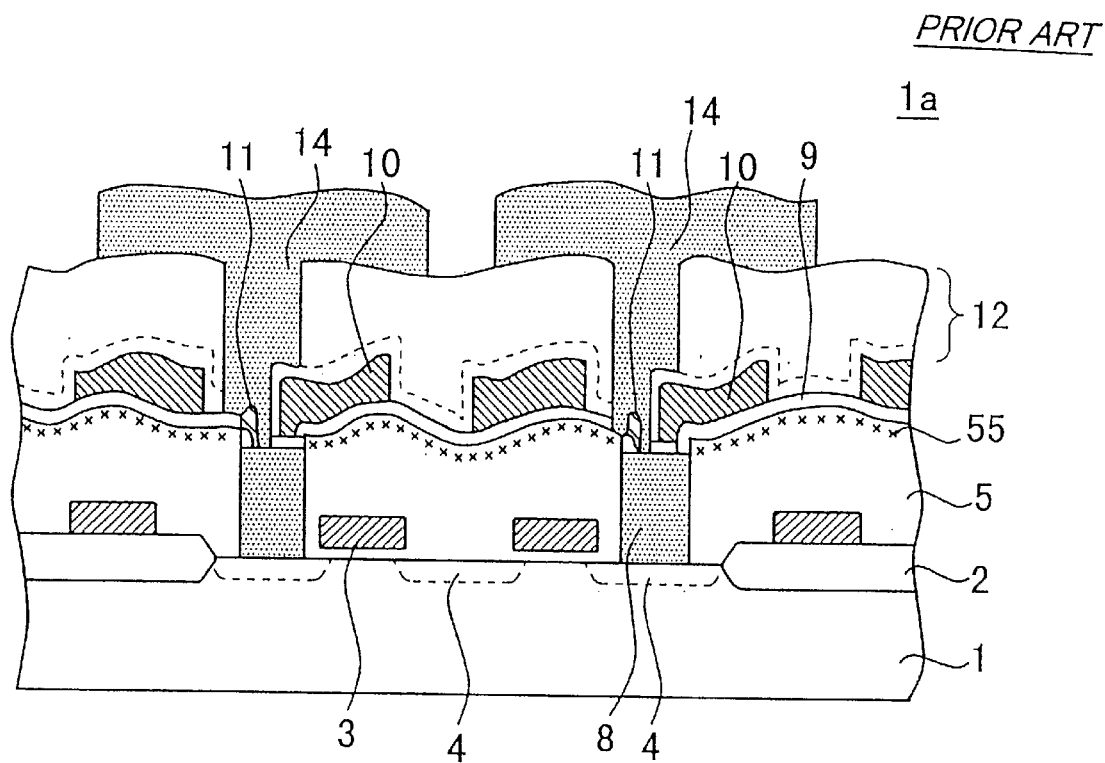
Figure 20:
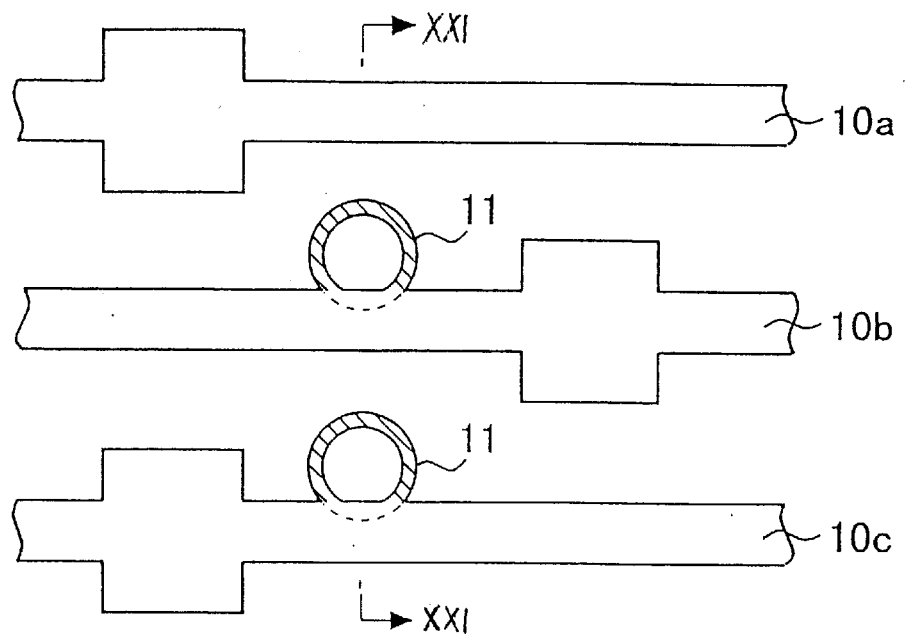
FIGS. 20 and 21 are illustrations for explaining the drawbacks in a conventional semiconductor integrated circuit.
Figure 21:
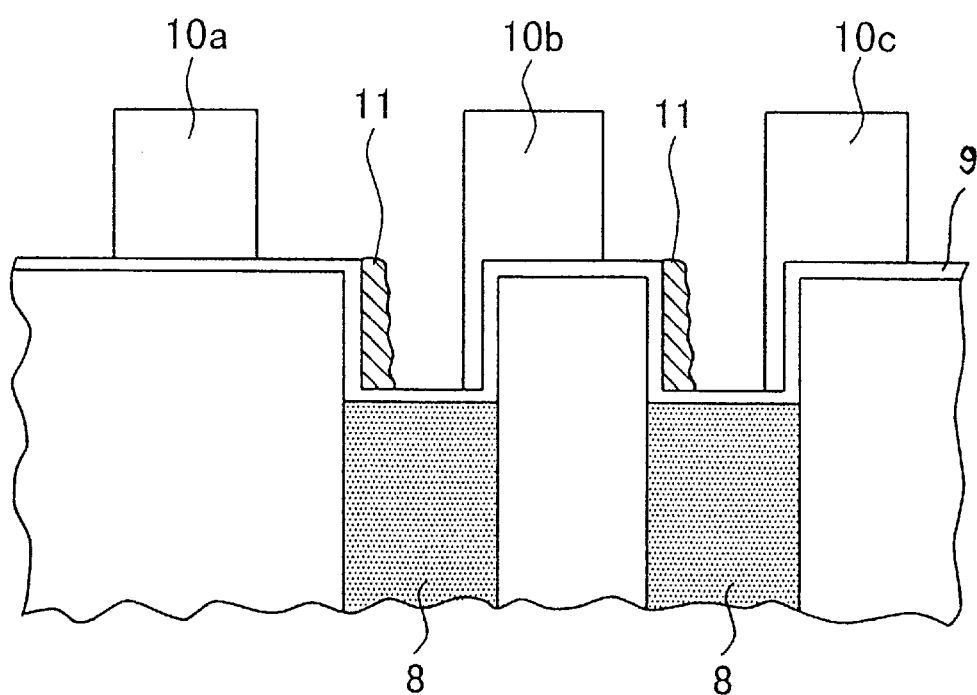
Figure 22:
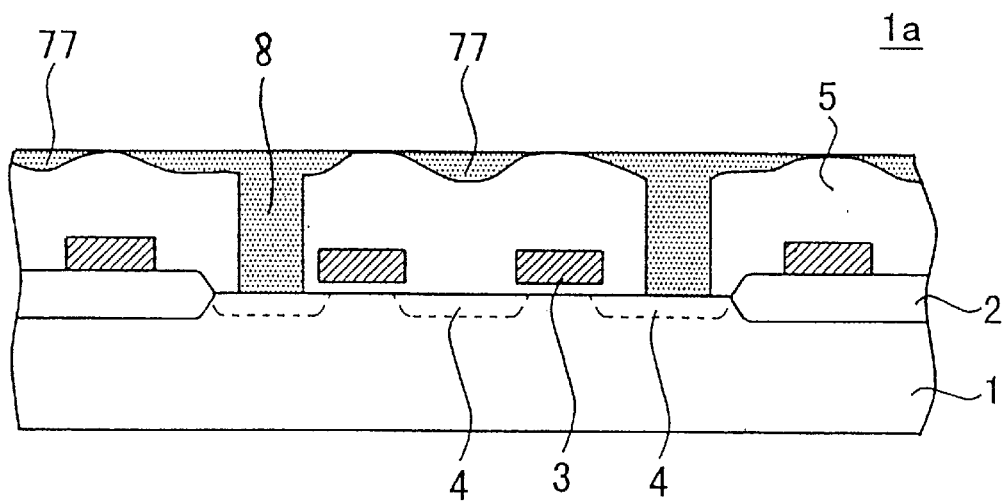
FIG. 22 shows another conventional manufacturing method.

FIG. 14 is a cross-sectional view showing another example of the structure of a semiconductor memory device according to the third embodiment. In FIG. 14, the second interconnect opening 13 has a diameter enlarged to such an extent as to cover the first wiring layer 10 coated with the insulating film 121. The second conductor plug 14 is cylindrically formed along the internal surface of the second interconnect opening 13. The interlayer insulating film 15 is formed along the internal surface of the second conductor plug 14 to extend onto the third insulating film 12, and an upper electrode 16 is formed on the internal surface of the interlayer insulating film 15 and extends so as to oveelap the third interlayer insulating film 12.

The second conductor plug 14 works as a lower electrode, or storage node, and the upper electrode 16 works as a cell plate. The capacity of the memory cell comprises the second conductor plug 14, the upper electrode 16, and the interlayer insulating film 15 interposed between them. In other respects, the semiconductor memory device is the same in structure as that shown in FIG. 13, and hence repeated explanations will be omitted here.

In this case, there is an advantageous result analogous to that described for the example shown in FIGS. 11 to 13.

Although the explanation has described the embodiments in which the first interlayer insulating film 5 is formed on the semiconductor substrate 1, the semiconductor substrate is not limited to a semiconductor substrate in a narrow sense. In this invention, the semiconductor substrate means a base member on which the first interlayer insulating film 5 is formed.

The effects and advantageous of the present invention may be summarized as follows.

As has been described above, according to the present invention, since interlayer insulating films and conductor plugs are formed so as to constitute a smooth and stepless wafer surface, no etch residues will be left on the surface of the interlayer insulating films even when a wiring layer is formed by anisotropic etching.

Consequently, even if a wiring layer is formed on an interconnect opening as a result of misalignment of a mask at the time of photolithography, short circuits are prevented from arising between the conductor plugs and the wiring layers.

As a result, wiring patterns can be designed at much smaller intervals, enabling miniaturization of a semiconductor integrated circuit device without causing short circuits.

Further, according to the present invention, since modified layers, which are formed along the surface of the interlayer insulating films when a conductive film is etched back, are removed by CMP, the deterioration of insulating characteristics of the interlayer insulating film is prevented.

Further, short circuits between wiring patterns are also prevented.

Still further, instability of characteristics of growth of a film, such as variations in film thickness or deterioration of reproducibility of a film, is prevented when a film is grown in an upper layer by CVD, and hence a film can be stably grown.

Accordingly, it is possible to achieve an improvement in the manufacturing yields of a semiconductor device or stabilization of electrical characteristics of a product, and a reduction in the manufacturing costs.

Obviously many modifications and variations of the present invention are possible in the light of the above teachings. It is therefore to be understood that within the scope of the appended claims the invention may by practiced otherwise than as specifically described.

What is claimed is:

1. A semiconductor device comprising:
    a first interlayer insulating film formed on a semiconductor substrate, the surface of said first interlayer insulating film being leveled;
    a plurlity of conductor plugs which are formed by filling each of a plurality of openings formed in said first interlayer insulating film so as to be level with said surface of said first interlayer insulating film;
    a second interlayer insulating film formed on said surface of said first interlayer insulating film and of said conductor plugs;
    a wiring pattern formed on said second interlayer insulating film;
    a third interlayer insulating film formed on said second interlayer insulating film so as to cover said wiring pattern; and
    a plurality of interconnect conductors formed by filling each of a plurality of the openings penetrating said second and third interlayer insulating films to said conductor plug, said interconnect conductors being electrically connected to each of said conductor plugs.

2. The semiconductor device as defined in claim 1, wherein each of said interconnect conductors is formed so as to have an enlarged diameter over said third insulating film, each of said interconnect conductors working as an electrode for storing electrical charge.

3. The semiconductor device as defined in claim 1, wherein said first interlayer insulating film is comprised of a silicon oxide film containing at least phosphor.

4. The semiconductor device as defined in claim 1, wherein each of said conductor plugs is comprised of polycrystalline silicon or amorphous silicon.

5. A semiconductor device comprising:
    a first interlayer insulating film continually formed on first and second regions of a semiconductor substrate, the surface of said first interlayer insulating film being leveled at least in said first region;
    a plurality of conductor plugs formed at least in said first region by filling openings formed in said first interlayer insulating film so as to be flush with said surface of said first interlayer insulating film;
    a second interlayer insulating film continually formed on said first interlayer insulating film and said conductor plugs so as to extend over said first and second regions;
    a wiring pattern formed on said surface of said second interlayer insulating film in at least said first region;

a third interlayer insulating film formed on said surface of said second interlayer insulating film so as to cover said wiring pattern; and a plurality of interconnect conductors formed in at least said first region by filling each of said openings penetrating said second and third interlayer insulating films to each of said conductor plugs, said interconnect conductors being electrically connected to each of said conductor plugs.

6. The semiconductor device as defined in claim 5, wherein said first region is formed as a memory array region; said second region is formed as a logic circuit region; and said interconnect conductor is formed to have an enlarged diameter over said third interlayer insulating film as an electrode for storing electrical charge.

7. The semiconductor device as defined in claim 5, wherein said first interlayer insulating film is comprised of a silicon oxide film containing at least phosphor.

8. The semiconductor device as defined in claim 5, wherein each of said conductor plugs is comprised of polycrystalline silicon or amorphous silicon.

* * * * *